United States Patent
Dai

(10) Patent No.: US 9,858,880 B2
(45) Date of Patent: Jan. 2, 2018

(54) GOA CIRCUIT BASED ON OXIDE SEMICONDUCTOR THIN FILM TRANSISTOR

(71) Applicant: Shenzhen China Star Optoelectronics Technology Co., Ltd., Shenzhen (CN)

(72) Inventor: Chao Dai, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 72 days.

(21) Appl. No.: 14/771,501

(22) PCT Filed: Jun. 23, 2015

(86) PCT No.: PCT/CN2015/082007
§ 371 (c)(1),
(2) Date: Aug. 30, 2015

(87) PCT Pub. No.: WO2016/192139
PCT Pub. Date: Dec. 8, 2016

(65) Prior Publication Data
US 2016/0351152 A1    Dec. 1, 2016

(30) Foreign Application Priority Data

Jun. 1, 2015    (CN) .......................... 2015 1 0292125

(51) Int. Cl.
| | |
|---|---|
| G09G 3/36 | (2006.01) |
| H01L 29/786 | (2006.01) |
| H01L 27/12 | (2006.01) |
| G09G 3/3266 | (2016.01) |

(52) U.S. Cl.
CPC ........ G09G 3/3677 (2013.01); G09G 3/3266 (2013.01); H01L 27/1225 (2013.01); H01L 27/1255 (2013.01); H01L 29/7869 (2013.01); G09G 2320/0214 (2013.01)

(58) Field of Classification Search
None
See application file for complete search history.

(56) References Cited

U.S. PATENT DOCUMENTS

2009/0304138 A1* 12/2009 Tsai .................. G11C 19/28
377/79

* cited by examiner

*Primary Examiner* — Amr Awad
*Assistant Examiner* — Donna Lui
(74) *Attorney, Agent, or Firm* — Leong C. Lei

(57) ABSTRACT

The present invention provides a GOA circuit based on oxide semiconductor thin film transistor, which cannot only prevent the electrical leakage to raise the reliability of the GOA circuit but also avoid the generation of the crossfire current in the non-function period by shorting the gate and the source of the fortieth thin film transistor (T40) in the first pull-down module (400) for avoiding the influence of the constant high voltage level (DCH) to the pull-down holding of the first node by electrically coupling both the gate and the drain of the seventy-fifth thin film transistor (T75) in the pull-down holding module (600) to the first node (Q(N)), and clearing the interference of the residual charge to the GOA circuit by providing the reset module (700) to reset the first node (Q(N)) before generating the each frame to guarantee the normal output of the GOA circuit and the normal display of the image.

11 Claims, 11 Drawing Sheets

US 9,858,880 B2

GOA CIRCUIT BASED ON OXIDE SEMICONDUCTOR THIN FILM TRANSISTOR

FIELD OF THE INVENTION

The present invention relates to a display technology field, and more particularly to a GOA circuit based on oxide semiconductor thin film transistor.

BACKGROUND OF THE INVENTION

The Liquid Crystal Display (LCD) possesses advantages of thin body, power saving and no radiation to be widely used in many application scope, such as LCD TV, mobile phone, personal digital assistant (PDA), digital camera, notebook, laptop, and dominates the flat panel display field.

Most of the liquid crystal displays on the present market are backlight type liquid crystal displays, which comprise a liquid crystal display panel and a backlight module. The working principle of the liquid crystal display panel is that the Liquid Crystal is injected between the Thin Film Transistor Array Substrate (TFT array substrate) and the Color Filter (CF). The light of backlight module is refracted to generate images by applying driving voltages to the two substrates for controlling the rotations of the liquid crystal molecules.

In the active liquid crystal display, each pixel is electrically coupled to a thin film transistor (TFT), and the gate of the thin film transistor is coupled to a level scan line, and the drain is coupled to a vertical data line, and the source is coupled to the pixel electrode. The enough voltage is applied to the level scan line, and all the TFTs electrically coupled to the horizontal scan line are activated. Thus, the signal voltage on the data line can be written into the pixel to control the transmittances of different liquid crystals to achieve the effect of controlling colors and brightness. The Gate Driver on Array or GOA for short which utilizes the array manufacture (Array) process of the liquid crystal display panel at present to manufacture the gate row scan driving circuit on the TFT array substrate for realizing the driving way of scanning the gates row by row. The GOA technology can reduce the bonding procedure of the external IC and has potential to raise the productivity and lower the production cost. Meanwhile, it can make the liquid crystal display panel more suitable to the narrow frame or non frame design of display products.

With the development of the oxide semiconductor thin film transistor, such as Indium Gallium Zinc Oxide (IGZO) thin film transistor, the peripheral circuit around the panel based on oxide semiconductor thin film transistor also becomes the focus that people pay lots of attentions. The oxide semiconductor has higher carrier mobility but the threshold voltage thereof is about 0V and the subthreshold range swing is smaller, the voltage Vgs between the gate and the source of many TFT elements as the GOA circuit is in off state generally is 0V. Thus, the design difficulty of the GOA circuit based on the oxide semiconductor thin film transistor will be increased. There will be some function issues happening when the design adaptable to the scan driving circuit for the amorphous silicon semiconductors is applied to the GOA circuit based on the oxide semiconductor thin film transistor.

Besides, due to some external factor inductions and the stress effect, there will be a tendency that the threshold voltage diminishes toward minus value to the oxide semiconductor thin film transistor, which may directly result in malfunction of the GOA circuit for the oxide semiconductor thin film transistors. For example, at high temperature, the threshold voltage of the oxide semiconductor thin film transistor will move toward minus value to result in failure of the GOA circuit; similarly, under the function electrical stress function of light irradiation, the threshold voltage of the oxide semiconductor thin film transistor will move toward minus value. Therefore, the influence of the threshold voltage of TFT has to be considered as designing the GOA circuit based on oxide semiconductor thin film transistor.

FIG. 1 shows a circuit diagram of a GOA circuit based on oxide semiconductor thin film transistor focusing on the aforesaid issue according to prior art, comprising a pull-up controlling module 100, a pull-up module 200, a transmission module 300, a first pull-down module 400, a bootstrap capacitor module 500 and a pull-down holding module 600. However, there are still some certain problems remaining in the GOA circuit based on oxide semiconductor thin film transistor according to prior art. For example, N is set to be a positive integer and in the GOA unit circuit of the Nth stage, with the provided first constant negative voltage level VSS and second constant negative voltage level DCL, the issue of crossfire current exists for the GOA unit circuit of the Nth stage in the non-function period; the drain of the thin film transistor T75 in the pull-down holding module 600 is electrically coupled to the constant high voltage level DCH, and the constant high voltage level DCH will influence the pull-down holding of the first node Q(N) in the non-function period; besides, as showing respective frames, the residual charge exists at the first node Q(N), which can affect the normal output of the GOA circuit and result in the abnormal display of the image.

SUMMARY OF THE INVENTION

An objective of the present invention is to provide a GOA circuit based on oxide semiconductor thin film transistor, which cannot only prevent the electrical leakage to raise the reliability of the GOA circuit but also avoid the generation of the crossfire current for avoiding the influence of the constant high voltage level to the pull-down holding of the first node, and clearing the interference of the residual charge to the GOA circuit to guarantee the normal output of the GOA circuit and the normal display of the image.

For realizing the aforesaid objective, the present invention provides a GOA circuit based on oxide semiconductor thin film transistor, comprising a plurality of GOA unit circuits which are cascade connected, and the GOA unit circuit of every stage comprises a pull-up controlling module, a pull-up module, a transmission module, a first pull-down module, a bootstrap capacitor module and a pull-down holding module;

N is set to be a positive integer and except the GOA unit circuit of the first stage, in the GOA unit circuit of the Nth stage:

the pull-up controlling module comprises an eleventh thin film transistor, and a gate of the eleventh thin film transistor receives a stage transfer signal of the GOA unit circuit of the former N−1 th stage, and a source is electrically coupled to a constant high voltage level, and a drain is electrically coupled to a first node;

the pull-up module comprises: a twenty-first thin film transistor, and a gate of the twenty-first thin film transistor is electrically coupled to the first node, and a source is electrically coupled to an mth set of clock signal corresponding to the GOA unit circuit of the Nth stage, and a drain outputs a scan driving signal;

the transmission module comprises: a twenty-second thin film transistor, and a gate of the twenty-second thin film transistor is electrically coupled to the first node, and a source is electrically coupled to the mth set of clock signal corresponding to the GOA unit circuit of the Nth stage, and a drain outputs a stage transfer signal;

the first pull-down module comprises a fortieth thin film transistor and a forty-first thin film transistor; both a gate and a source of the fortieth thin film transistor are electrically coupled to the first node, and a drain is electrically coupled to a drain of the forty-first thin film transistor; a gate of the forty-first thin film transistor is inputted with an m+2th set of clock signal corresponding to the GOA unit circuit of the after next N+2th stage, and a source is inputted with the scan driving signal;

the bootstrap capacitor module comprises a capacitor, and one end of the capacitor is electrically coupled to the first node, and the other end is electrically coupled to the scan drive signal;

the pull-down holding module comprises: a dual inverter composed by a plurality of thin film transistor, a forty-second thin film transistor, a thirty-second thin film transistor, a seventy-fifth thin film transistor and a seventy-sixth thin film transistor; an input end of the dual inverter is electrically coupled to the first node, and an output end is electrically coupled to a second node; a gate of the forty-second thin film transistor is electrically coupled to the second node, and a drain is electrically coupled to the first node, and a source is electrically coupled to a third node; a gate of the thirty-second thin film transistor is electrically coupled to the second node, and a drain is electrically coupled to the scan driving signal, and a source is electrically coupled to a first constant negative voltage level; both a gate and a drain of the seventy-fifth thin film transistor are electrically coupled to the first node, and a source is electrically coupled to the third node; a gate of the seventy-sixth thin film transistor is electrically coupled to the second node, and a drain is electrically coupled to the third node, and a source is electrically coupled to a second constant negative voltage level;

the second constant negative voltage level is lower than the first constant negative voltage level;

all the thin film transistors are oxide semiconductor thin film transistors.

The GOA circuit based on oxide semiconductor thin film transistor further comprises a reset module, employed to reset the first node before generating the each frame.

Selectably, the reset module comprises a ninth thin film transistor, and a gate of the ninth thin film transistor receives a scan activation signal, and a drain is electrically coupled to the first node, and a source is electrically coupled to the first constant negative voltage level.

Selectably, the reset module comprises a ninth thin film transistor, and a gate of the ninth thin film transistor receives a scan activation signal, and a drain is electrically coupled to the first node, and a source is electrically coupled to the mth set of clock signal corresponding to the GOA unit circuit of the Nth stage.

Selectably, the reset module comprises a ninth thin film transistor, and a gate of the ninth thin film transistor receives a reset signal, and a drain is electrically coupled to the first node, and a source is electrically coupled to the mth set of clock signal corresponding to the GOA unit circuit of the Nth stage; the reset signal is generated before the scan activation signal.

Selectably, the clock signal is set to comprises M sets, and M is an integer multiple of 4, and as N>M, the reset module is set in the GOA unit circuit of the Nth stage.

Selectably, the reset module is provided in the GOA unit circuit of every stage.

Selectably, the clock signal totally comprises four sets: a first set of clock signal, a second set of clock signal, a third set of clock signal and a fourth set of clock signal; as the mth set of clock signal is the third set of clock signal, an m+2th set of clock signal is the first set of clock signal, and as the mth set of clock signal is the fourth set of clock signal, the m+2th set of clock signal is the second set of clock signal; waveform duty ratio of the four sets of clock signals is 25/75;

the reset module is provided in the GOA unit circuits from the fifth stage to the last stage.

the dual inverter comprises: a fifty-first thin film transistor, and both a gate and a source of the fifty-first thin film transistor are electrically coupled to the constant high voltage level, and a drain is electrically coupled to a fourth node; a fifty-second thin film transistor, and a gate of the fifty-second thin film transistor is electrically coupled to the first node, and a drain is electrically coupled to the fourth node, and a source is electrically coupled to the first constant negative voltage level; a fifty-third thin film transistor, and a gate of the fifty-third thin film transistor is electrically coupled to the fourth node, and a source is electrically coupled to the constant high voltage level, and a drain is electrically coupled to the second node; a fifty-fourth thin film transistor, and a gate of the fifty-fourth thin film transistor is electrically coupled to the first node, and a drain is electrically coupled to the second node, and a source is electrically coupled to a fifth node; a seventy-third thin film transistor, and a gate of the seventy-third thin film transistor is electrically coupled to the fourth node, and a source is electrically coupled to the constant high voltage level, and a drain is electrically coupled to the fifth node; a seventy-fourth thin film transistor, and a gate of the seventy-fourth thin film transistor is electrically coupled to the first node, and a source is electrically coupled to the second constant negative voltage level, and a drain is electrically coupled to the fifth node; wherein the fifty-first thin film transistor, the fifty-second thin film transistor, the fifty-third thin film transistor and the fifty-fourth thin film transistor construct a main inverter, and the seventy-third thin film transistor and the seventy-fourth thin film transistor construct an auxiliary inverter.

In the GOA unit circuit of the first stage, the gate of the eleventh thin film transistor receives a scan activation signal.

The present invention further provides a GOA circuit based on oxide semiconductor thin film transistor, comprising a plurality of GOA unit circuits which are cascade connected, and the GOA unit circuit of every stage comprises a pull-up controlling module, a pull-up module, a transmission module, a first pull-down module, a bootstrap capacitor module and a pull-down holding module;

N is set to be a positive integer and except the GOA unit circuit of the first stage, in the GOA unit circuit of the Nth stage:

the pull-up controlling module comprises an eleventh thin film transistor, and a gate of the eleventh thin film transistor receives a stage transfer signal of the GOA unit circuit of the former N−1 th stage, and a source is electrically coupled to a constant high voltage level, and a drain is electrically coupled to a first node;

the pull-up module comprises: a twenty-first thin film transistor, and a gate of the twenty-first thin film transistor is electrically coupled to the first node, and a source is electrically coupled to an mth set of clock signal corresponding to the GOA unit circuit of the Nth stage, and a drain outputs a scan driving signal;

the transmission module comprises: a twenty-second thin film transistor, and a gate of the twenty-second thin film transistor is electrically coupled to the first node, and a source is electrically coupled to the mth set of clock signal corresponding to the GOA unit circuit of the Nth stage, and a drain outputs a stage transfer signal;

the first pull-down module comprises a fortieth thin film transistor and a forty-first thin film transistor; both a gate and a source of the fortieth thin film transistor are electrically coupled to the first node, and a drain is electrically coupled to a drain of the forty-first thin film transistor; a gate of the forty-first thin film transistor is inputted with an m+2th set of clock signal corresponding to the GOA unit circuit of the after next N+2th stage, and a source is inputted with the scan driving signal;

the bootstrap capacitor module comprises a capacitor, and one end of the capacitor is electrically coupled to the first node, and the other end is electrically coupled to the scan drive signal;

the pull-down holding module comprises: a dual inverter composed by a plurality of thin film transistor, a forty-second thin film transistor, a thirty-second thin film transistor, a seventy-fifth thin film transistor and a seventy-sixth thin film transistor; an input end of the dual inverter is electrically coupled to the first node, and an output end is electrically coupled to a second node; a gate of the forty-second thin film transistor is electrically coupled to the second node, and a drain is electrically coupled to the first node, and a source is electrically coupled to a third node; a gate of the thirty-second thin film transistor is electrically coupled to the second node, and a drain is electrically coupled to the scan driving signal, and a source is electrically coupled to a first constant negative voltage level; both a gate and a drain of the seventy-fifth thin film transistor are electrically coupled to the first node, and a source is electrically coupled to the third node; a gate of the seventy-sixth thin film transistor is electrically coupled to the second node, and a drain is electrically coupled to the third node, and a source is electrically coupled to a second constant negative voltage level;

the second constant negative voltage level is lower than the first constant negative voltage level;

all the thin film transistors are oxide semiconductor thin film transistors;

the GOA unit circuit further comprises a reset module, employed to reset the first node before generating the each frame;

wherein the dual inverter comprises: a fifty-first thin film transistor, and both a gate and a source of the fifty-first thin film transistor are electrically coupled to the constant high voltage level, and a drain is electrically coupled to a fourth node; a fifty-second thin film transistor, and a gate of the fifty-second thin film transistor is electrically coupled to the first node, and a drain is electrically coupled to the fourth node, and a source is electrically coupled to the first constant negative voltage level; a fifty-third thin film transistor, and a gate of the fifty-third thin film transistor is electrically coupled to the fourth node, and a source is electrically coupled to the constant high voltage level, and a drain is electrically coupled to the second node; a fifty-fourth thin film transistor, and a gate of the fifty-fourth thin film transistor is electrically coupled to the first node, and a drain is electrically coupled to the second node, and a source is electrically coupled to a fifth node; a seventy-third thin film transistor, and a gate of the seventy-third thin film transistor is electrically coupled to the fourth node, and a source is electrically coupled to the constant high voltage level, and a drain is electrically coupled to the fifth node; a seventy-fourth thin film transistor, and a gate of the seventy-fourth thin film transistor is electrically coupled to the first node, and a source is electrically coupled to the second constant negative voltage level, and a drain is electrically coupled to the fifth node; wherein the fifty-first thin film transistor, the fifty-second thin film transistor, the fifty-third thin film transistor and the fifty-fourth thin film transistor construct a main inverter, and the seventy-third thin film transistor and the seventy-fourth thin film transistor construct an auxiliary inverter;

wherein in the GOA unit circuit of the first stage, the gate of the eleventh thin film transistor receives a scan activation signal;

wherein the reset module comprises a ninth thin film transistor, and a gate of the ninth thin film transistor receives a reset signal, and a drain is electrically coupled to the first node, and a source is electrically coupled to the mth set of clock signal corresponding to the GOA unit circuit of the Nth stage; the reset signal is generated before the scan activation signal.

The benefits of the present invention are: the present invention provides a GOA circuit based on oxide semiconductor thin film transistor, which cannot only prevent the electrical leakage to raise the reliability of the GOA circuit but also avoid the generation of the crossfire current in the non-function period by shorting the gate and the source of the fortieth thin film transistor in the first pull-down module for avoiding the influence of the constant high voltage level to the pull-down holding of the first node by electrically coupling both the gate and the drain of the seventy-fifth thin film transistor in the pull-down holding module to the first node, and clearing the interference of the residual charge to the GOA circuit by providing the reset module to reset the first node before generating the each frame to guarantee the normal output of the GOA circuit and the normal display of the image.

BRIEF DESCRIPTION OF THE DRAWINGS

In order to better understand the characteristics and technical aspect of the invention, please refer to the following detailed description of the present invention is concerned with the diagrams, however, provide reference to the accompanying drawings and description only and is not intended to be limiting of the invention.

In drawings.

DETAILED DESCRIPTION OF PREFERRED EMBODIMENTS

Figure 1:
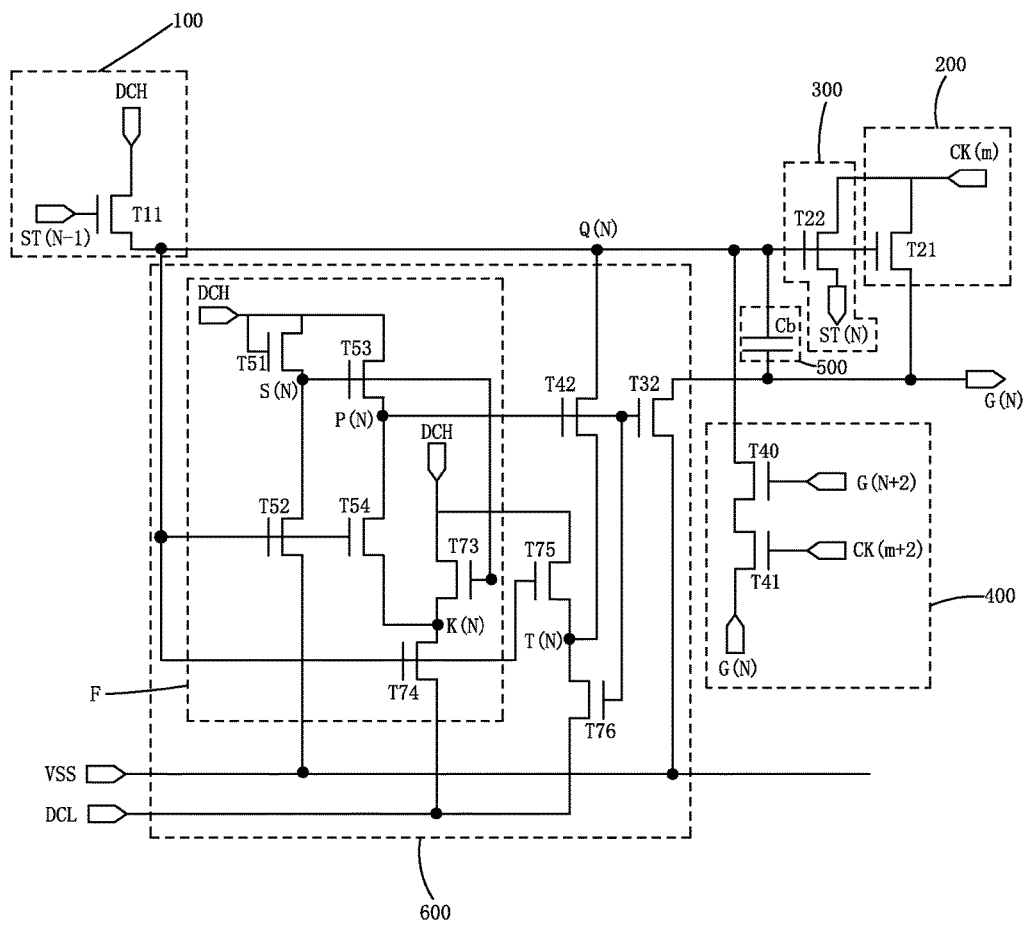
FIG. 1 is a circuit diagram of a GOA circuit based on oxide semiconductor thin film transistor according to prior art.

For better explaining the technical solution and the effect of the present invention, the present invention will be further described in detail with the accompanying drawings and the specific embodiments.

The present invention provides a GOA circuit based on oxide semiconductor thin film transistor. Please refer to FIG. 2, which is a circuit diagram of the first embodiment according to a GOA circuit based on oxide semiconductor thin film transistor of the present invention, comprising a plurality of GOA unit circuits which are cascade connected, and all the GOA unit circuit of every stage comprises a pull-up controlling module 100, a pull-up module 200, a transmission module 300, a first pull-down module 400, a bootstrap capacitor module 500 and a pull-down holding module 600.

N is set to be a positive integer and except the GOA unit circuit of the first stage, in the GOA unit circuit of the Nth stage:

the pull-up controlling module 100 comprises an eleventh thin film transistor T11, and a gate of the eleventh thin film transistor T11 receives a stage transfer signal ST(N−1) of the GOA unit circuit of the former N−1th stage, and a source is electrically coupled to a constant high voltage level DCH, and a drain is electrically coupled to a first node Q(N).

The pull-up module 200 comprises: a twenty-first thin film transistor T21, and a gate of the twenty-first thin film transistor T21 is electrically coupled to the first node Q(N), and a source is electrically coupled to an mth set of clock signal CK(m) corresponding to the GOA unit circuit of the Nth stage, and a drain outputs a scan driving signal G(N).

The pull-down module 300 comprises: a twenty-second thin film transistor T22, and a gate of the twenty-second thin film transistor T22 is electrically coupled to the first node Q(N), and a source is electrically coupled to the mth set of clock signal CK(m) corresponding to the GOA unit circuit of the Nth stage, and a drain outputs the stage transfer signal ST(N).

The first pull-down module 400 comprises a fortieth thin film transistor T40 and a forty-first thin film transistor T41; both a gate and a source of the fortieth thin film transistor T40 are electrically coupled to the first node Q(N), and a drain is electrically coupled to a drain of the forty-first thin film transistor T41; a gate of the forty-first thin film transistor T41 is inputted with an m+2th set of clock signal CK(m+2) corresponding to the GOA unit circuit of the after next N+2th stage, and a source is inputted with the scan driving signal G(N).

The bootstrap capacitor module 500 comprises a capacitor Cb, and one end of the capacitor Cb is electrically coupled to the first node Q(N), and the other end is electrically coupled to the scan drive signal G(N).

The pull-down holding module 600 comprises: a dual inverter F composed by a plurality of thin film transistor, a forty-second thin film transistor T42, a thirty-second thin film transistor T32, a seventy-fifth thin film transistor T75 and a seventy-sixth thin film transistor T76; an input end of the dual inverter F is electrically coupled to the first node Q(N), and an output end is electrically coupled to a second node P(N); a gate of the forty-second thin film transistor T42 is electrically coupled to the second node P(N), and a drain is electrically coupled to the first node Q(N), and a source is electrically coupled to a third node T(N); a gate of the thirty-second thin film transistor T32 is electrically coupled to the second node P(N), and a drain is electrically coupled to the scan driving signal G(N), and a source is electrically coupled to a first constant negative voltage level VSS; both a gate and a drain of the seventy-fifth thin film transistor T75 are electrically coupled to the first node Q(N), and a source is electrically coupled to the third node T(N); a gate of the seventy-sixth thin film transistor T76 is electrically coupled to the second node P(N), and a drain is electrically coupled to the third node T(N), and a source is electrically coupled to a second constant negative voltage level DCL. Specifically, the dual inverter F comprises: a fifty-first thin film transistor T51, and both a gate and a source of the fifty-first thin film transistor T51 are electrically coupled to the constant high voltage level DCH, and a drain is electrically coupled to a fourth node S(N); a fifty-second thin film transistor T52, and a gate of the fifty-second thin film transistor T52 is electrically coupled to the first node Q(N), and a drain is electrically coupled to the fourth node S(N), and a source is electrically coupled to the first constant negative voltage level VSS; a fifty-third thin film transistor T53, and a gate of the fifty-third thin film transistor T53 is electrically coupled to the fourth node S(N), and a source is electrically coupled to the constant high voltage level DCH, and a drain is electrically coupled to the second node P(N); a fifty-fourth thin film transistor T54, and a gate of the fifty-fourth thin film transistor T54 is electrically coupled to the first node Q(N), and a drain is electrically coupled to the second node P(N), and a source is electrically coupled to a fifth node K(N); a seventy-third thin film transistor T73, and a gate of the seventy-third thin film transistor T73 is electrically coupled to the fourth node S(N), and a source is electrically coupled to the constant high voltage level DCH, and a drain is electrically coupled to the fifth node K(N); a seventy-fourth thin film transistor T74, and a gate of the seventy-fourth thin film transistor T74 is electrically coupled to the first node Q(N), and a source is electrically coupled to the second constant negative voltage level DCL, and a drain is electrically coupled to the fifth node K(N); wherein the fifty-first thin film transistor T51, the fifty-second thin film transistor T52, the fifty-third thin film transistor T53 and the fifty-fourth thin film transistor T54 construct a main inverter, and the seventy-third thin film transistor T73 and the seventy-fourth thin film transistor T74 construct an auxiliary inverter.

All the thin film transistors are oxide semiconductor thin film transistors. Preferably, the oxide semiconductor thin film transistors are IGZO thin film transistors.

Figure 5:
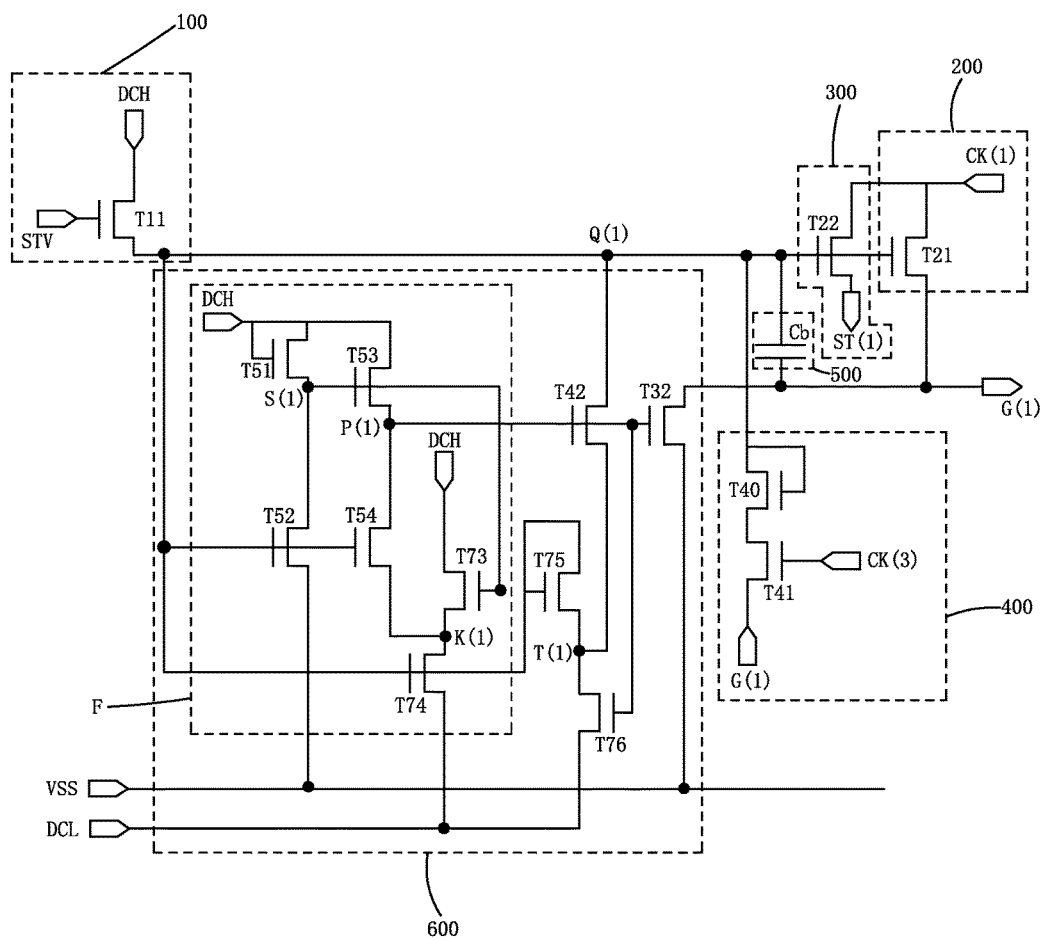
FIG. 5 is a connection relationship diagram of a GOA unit circuit of the first stage in the first, second, third embodiments according to the GOA circuit based on oxide semiconductor thin film transistor of the present invention.

Particularly, referring to FIG. 5, in the GOA unit circuit of the first stage in the first embodiment of the present invention, the gate of the eleventh thin film transistor T11 receives a scan activation signal STV, and both the source of the twenty-first thin film transistor T21 and the source of the twenty-second thin film transistor T22 are electrically coupled to the first set of clock signal CK(1), and the gate of the forty-first thin film transistor T41 is inputted with the third set of clock signal CK(3) corresponding to the GOA unit circuit of the after next third stage, and the source is inputted with the scan driving signal G(1).

Figure 2:
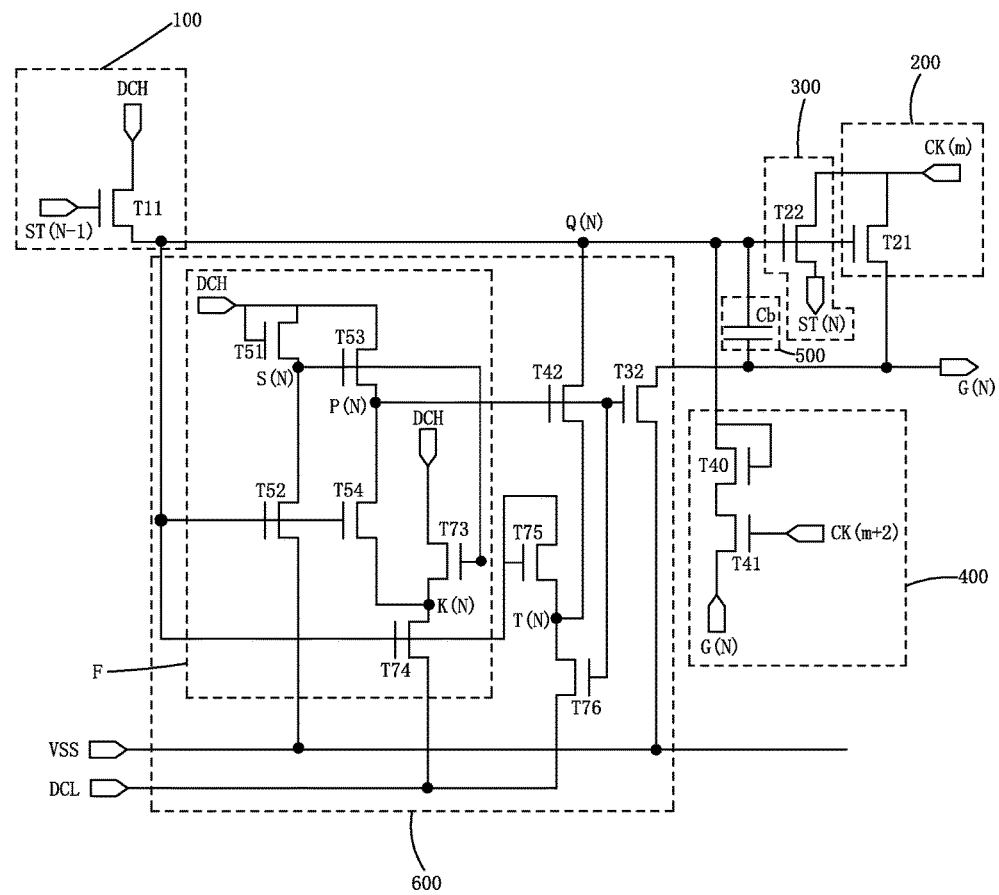
FIG. 2 is a circuit diagram of the first embodiment according to a GOA circuit based on oxide semiconductor thin film transistor of the present invention.
Figure 3:
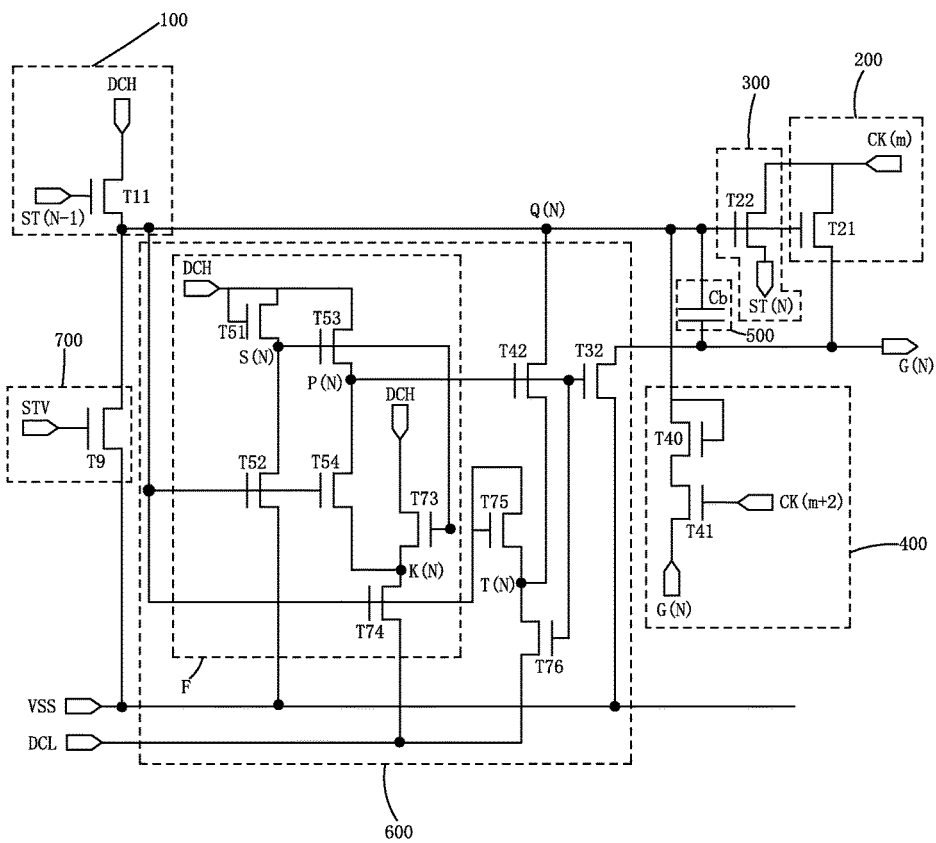
FIG. 3 is a circuit diagram of the second embodiment according to a GOA circuit based on oxide semiconductor thin film transistor of the present invention.
Figure 4:
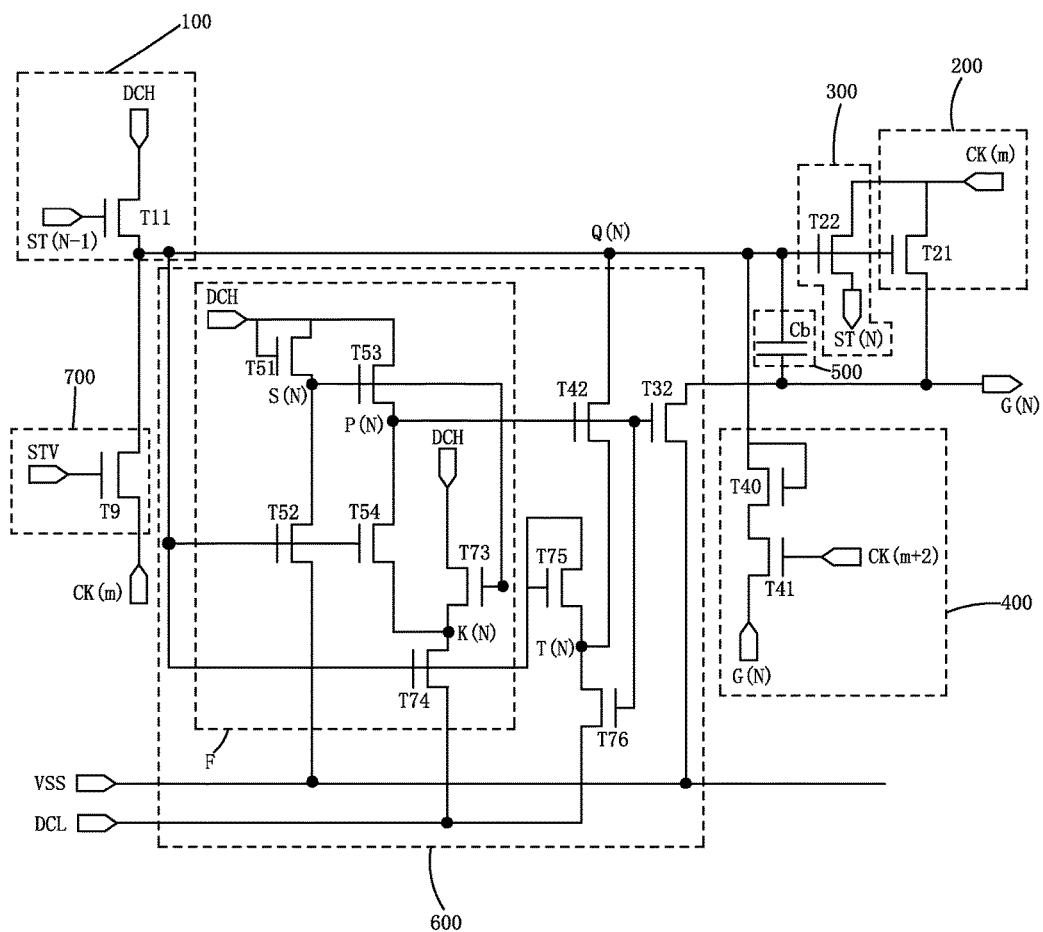
FIG. 4 is a circuit diagram of the third embodiment according to a GOA circuit based on oxide semiconductor thin film transistor of the present invention.
Figure 6:
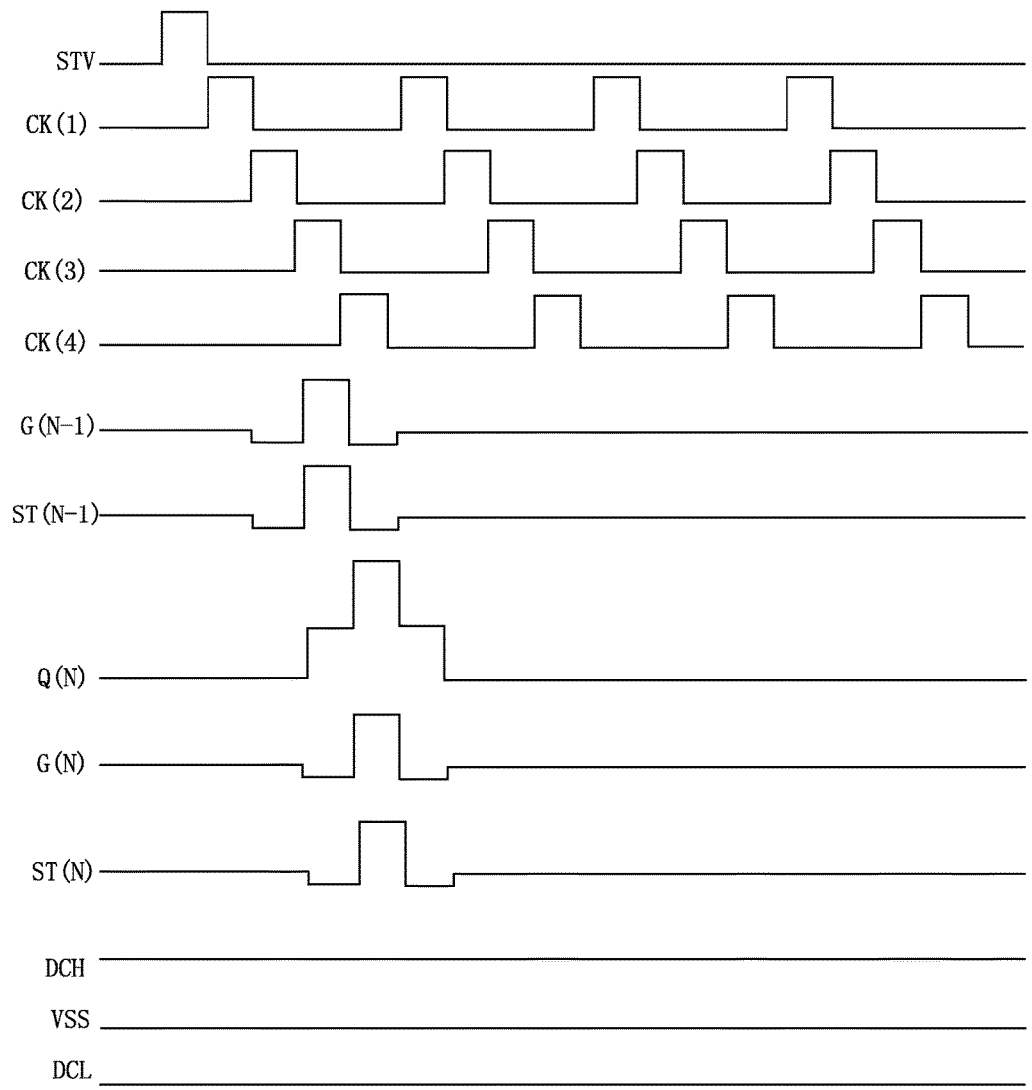
FIG. 6 is a waveform diagram of input signals and key nodes of the first, second, third embodiments according to the GOA circuit based on oxide semiconductor thin film transistor of the present invention.

Please refer to FIG. 2 and FIG. 6 at the same time. The working procedure of the first embodiment according to the GOA unit circuit of the present invention is: the scan activation signal STV activates the GOA unit circuit of the first stage, and then performs scan driving sequentially stage by stage. When the scan driving is performed to the GOA unit circuit of the Nth stage, and the stage transfer signal ST(N−1) of the GOA unit circuit of the former N−1th stage is high voltage level, the eleventh thin film transistor T11 is activated, and the constant high voltage level DCH raises the first node Q(N) to the high voltage level through the eleventh thin film transistor T11, and charges the capacitor Cb. Subsequently, the stage transfer signal ST(N−1) of the GOA unit circuit of the N−1th stage is changed to be low voltage level, and the eleventh thin film transistor T11 is deactivated, and the first node Q(N) is kept to be high voltage level through the capacitor Cb to make that the twenty-first thin film transistor T21 and the twenty-second thin film transistor T22 are activated. Then, the mth set of clock signal CK(m) corresponding to the GOA unit circuit of the Nth stage is changed to be high voltage level, and the drain of the twenty-first thin film transistor T21 outputs the scan driving signal G(N) of high voltage level, and the drain of the twenty-second thin film transistor T22 outputs the stage transfer signal ST(N) of high voltage level. Meanwhile, the mth set of clock signal CK(m) continues to charge the capacitor Cb through the twenty-first thin film transistor T21 to raise the first node Q(N) to a higher voltage level. Thereafter, the scan driving signal G(N) is changed to be low voltage level along with the mth set of clock signal CK(m), and the m+2th set of clock signal CK(m+2) corresponding to the GOA unit circuit of the after next N+2th stage is high voltage level, and the forty-first thin film transistor T41 and the fortieth thin film transistor T40 are activated, and the first node Q(N) is discharged through the pull-down module 400 and changed to be low voltage level.

The time slot as the scan driving signal G(N) is high voltage level is generally named as the functioning period. In the functioning period, the first node Q(N) is high voltage level, and the source of the eleventh thin film transistor T11 receives the constant high voltage level DCH, and thus, the first node Q(N) does not generate electrical leakage through the eleventh thin film transistor T11; meanwhile, the first node Q(N) is high voltage level, and the second node P(N) inverted by the inverter F is low voltage level, and both the forty-second thin film transistor T42 and the thirty-second thin film transistor T32 are deactivated to ensure that the first node Q(N) and the scan drive signal G(N) steadily output high voltage levels; the high voltage level of the first node Q(N) is transmitted to the source of the forty-second thin film transistor T42 through the seventy-fifth thin film transistor T75, and thus, the first node Q(N) does not generate electrical leakage through the forty-second thin film transistor T42; the forty-first thin film transistor T41 is now in deactivation state, and the source of the forty-first thin film transistor T41 is inputted with the scan driving signal G(N) of high voltage level, and the first node Q(N) does not generate electrical leakage through the series path of the forty-first thin film transistor T41 and the fortieth thin film transistor T40, either.

In the non-functioning period, as the first node Q(N) is changed to be low voltage level, and the inverter F outputs high voltage level, i.e. the second node P(N) is high voltage level, and all of the forty-second thin film transistor T42, the thirty-second thin film transistor T32 and the seventy-sixth thin film transistor T76 are activated. With the forty-second thin film transistor T42 and the seventy-sixth thin film transistor T76, the first node Q(N) is further pulled down and kept to be the second constant negative voltage level DCL; with the thirty-second thin film transistor T32, the scan driving signal G(N) is further pulled down and kept to be the first constant negative voltage level VSS. At this moment, the fortieth thin film transistor T40 utilizes the diode-connection, i.e. the gate and the source of the fortieth thin film transistor T40 are shorted, and the gate-source voltage Vgs of the fortieth thin film transistor T40 is equal to 0V. Compared with the prior art, of which the gate of the fortieth thin film transistor T40 is coupled to the scan driving signal G(N+2) of the GOA unit circuit of the N+2th stage, it is capable of avoiding the crossfire current caused by the second constant negative voltage level DCL to flow through the fortieth thin film transistor T40. The drain of the seventy-fifth thin film transistor T75 is electrically coupled to the first node Q(N), and the source of the source of the forty-second thin film transistor T42 is electrically coupled to drain of the seventy-fifth thin film transistor T75, compared with the prior art, of which the drain of the seventy-fifth thin film transistor T75 is electrically coupled to the constant high voltage level DCH, it is capable of avoiding the influence of the constant high voltage level DCH to the pull-down holding of the first node in the non-function period.

Furthermore, the second constant negative voltage level DCL is lower than the first constant negative voltage level VSS for being convenient for the individual and independent control. As the first node Q(N) is high voltage level in the functioning period, the both the fifty-second thin film transistor T52 and the fifty-fourth thin film transistor T54 in the main inverter of the dual inverter F are activated, and the fifty-third thin film transistor T53 are deactivated. The seventy-fourth thin film transistor T74 in the auxiliary inverter is activated, and the seventy-third thin film transistor T73 is deactivated, and the voltage level of the second node P(N) is pulled down to the second constant negative voltage source DCL which lower than the first constant negative voltage source VSS for ensuring that the first node Q(N) and the scan drive signal G(N) steadily output high voltage levels; as the first node Q(N) is low voltage level in the non-function period, both the fifty-second thin film transistor T52 and the fifty-fourth thin film transistor T54 in the main inverter of the dual inverter F are deactivated, and both the fifty-first thin film transistor T51 and the fifty-third thin film transistor T53 are activated, and the seventy-fourth thin film transistor T74 in the auxiliary inverter is deactivated, and the seventy-third thin film transistor T73 is activated to prevent the electrical leakage of the fifty-forth thin film transistor T54, and the voltage level of the second node P(N) is kept to be the constant high voltage level DCH which can keep the low voltage levels of the first node Q(N) and the scan drive signal G(N).

Please refer to FIG. 3, FIG. 5, FIG. 6 and FIG. 7 at the same time, which are the second embodiment according to a GOA circuit based on oxide semiconductor thin film transistor of the present invention. The difference of the second embodiment from the first embodiment is that a reset module 700 is added. Specifically, the reset module 700 comprises a ninth thin film transistor T9, and a gate of the ninth thin film transistor T9 receives a scan activation signal STV, and a drain is electrically coupled to the first node Q(N), and a source is electrically coupled to the first constant negative voltage level VSS. The reset module 700 is employed to reset the first node Q(N) with the scan activation signal STV before generating the each frame to clear the interference of the residual charge to the GOA circuit, and meanwhile, to clear the first node Q(N) before generating the first frame to prevent the influence of the first frame, which is blank, to the GOA circuit to guarantee the normal output of the GOA circuit and the normal display of the image.

Figure 7:
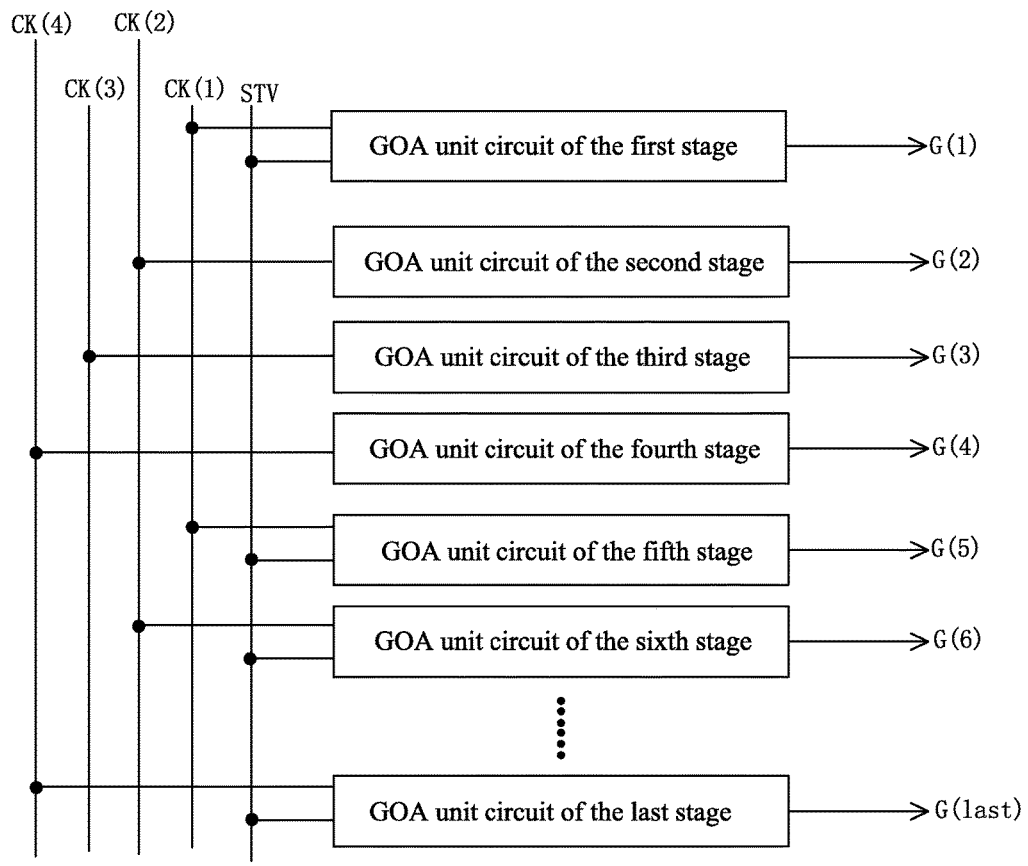
FIG. 7 is a connection structure diagram of the second, third embodiments according to the GOA circuit based on oxide semiconductor thin film transistor of the present invention.
Figure 8:
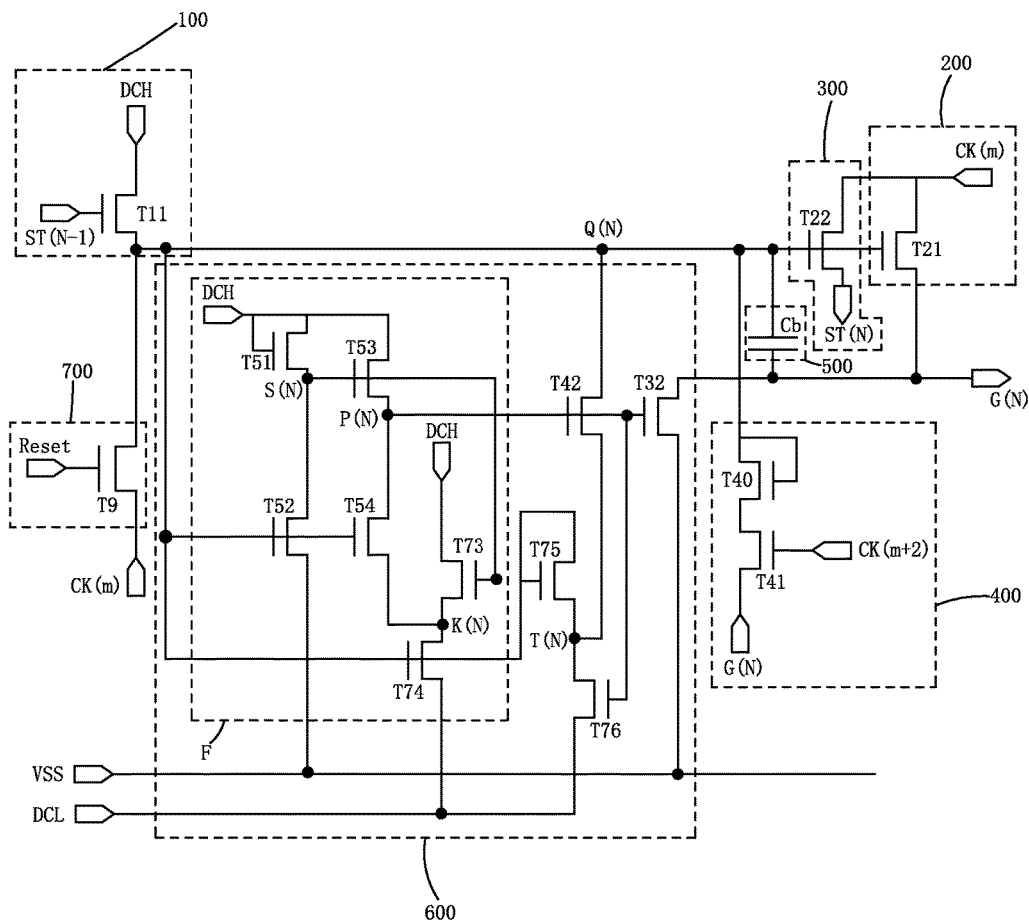
FIG. 8 is a circuit diagram of the fourth embodiment according to a GOA circuit based on oxide semiconductor thin film transistor of the present invention.

Specifically, the clock signal is set to comprises M sets, and M is an integer multiple of 4, and as N>M, the reset module 700 is set in the GOA unit circuit of the Nth stage. For example, the clock signal totally comprising four sets in FIG. 6 and FIG. 7 is illustrated. From the GOA unit circuit of the fifth stage, the reset module 700 is provided in all the GOA unit circuits from the fifth stage to the last stage. Correspondingly, all the GOA unit circuits from the fifth stage to the last stage are required to receive the scan activation signal STV employed to control the reset module 700; the reset module 700 is not provided in all the GOA unit circuits from the first stage to the fourth stage, and only the GOA unit circuit of the first stage is required to receive the scan activation signal STV employed for activating the scan driving. Specifically, the four sets of clock signals comprises a first set of clock signal CK(1), a second set of clock signal CK(2), a third set of clock signal CK(3) and a fourth set of clock signal CK(4); as the mth set of clock signal CK(m) is the third set of clock signal CK(3), an m+2th set of clock signal CK(m+2) is the first set of clock signal CK(1), and as the mth set of clock signal CK(m) is the fourth set of clock signal CK(4), the m+2th set of clock signal CK(m+2) is the second set of clock signal CK(2); waveform duty ratio of the four sets of clock signals is 25/75 to avoid the influence of the waveform of the clock signal to the first pull-down module 400, and the waveform at the first node Q(N) appears to be convex.

Similarly, if the clock signal totally comprises eight sets, from the GOA unit circuit of the ninth stage, the reset module 700 is provided in all the GOA unit circuits from the ninth stage to the last stage. Correspondingly, all the GOA unit circuits from the ninth stage to the last stage are required to receive the scan activation signal STV employed to control the reset module 700; the reset module 700 is not provided in all the GOA unit circuits from the first stage to the eighth stage, and only the GOA unit circuit of the first stage is required to receive the scan activation signal STV employed for activating the scan driving.

The rest circuit structure and working procedure are the same as those described in the first embodiment. The repeated explanation is omitted here.

Please refer to FIG. 4, FIG. 5, FIG. 6 and FIG. 7, which are the third embodiment according to a GOA circuit based on oxide semiconductor thin film transistor of the present invention. The difference of the third embodiment from the second embodiment merely is that the source of the ninth thin film transistor T9 is electrically coupled to the mth set of clock signal CK(m) corresponding to the GOA unit circuit of the Nth stage. The benefit of this is to reduce the leakage influence of the ninth thin film transistor T9 to the first node Q(N) in the functioning period. The reset is the same as the second embodiment. The repeated description is omitted here.

Figure 9:
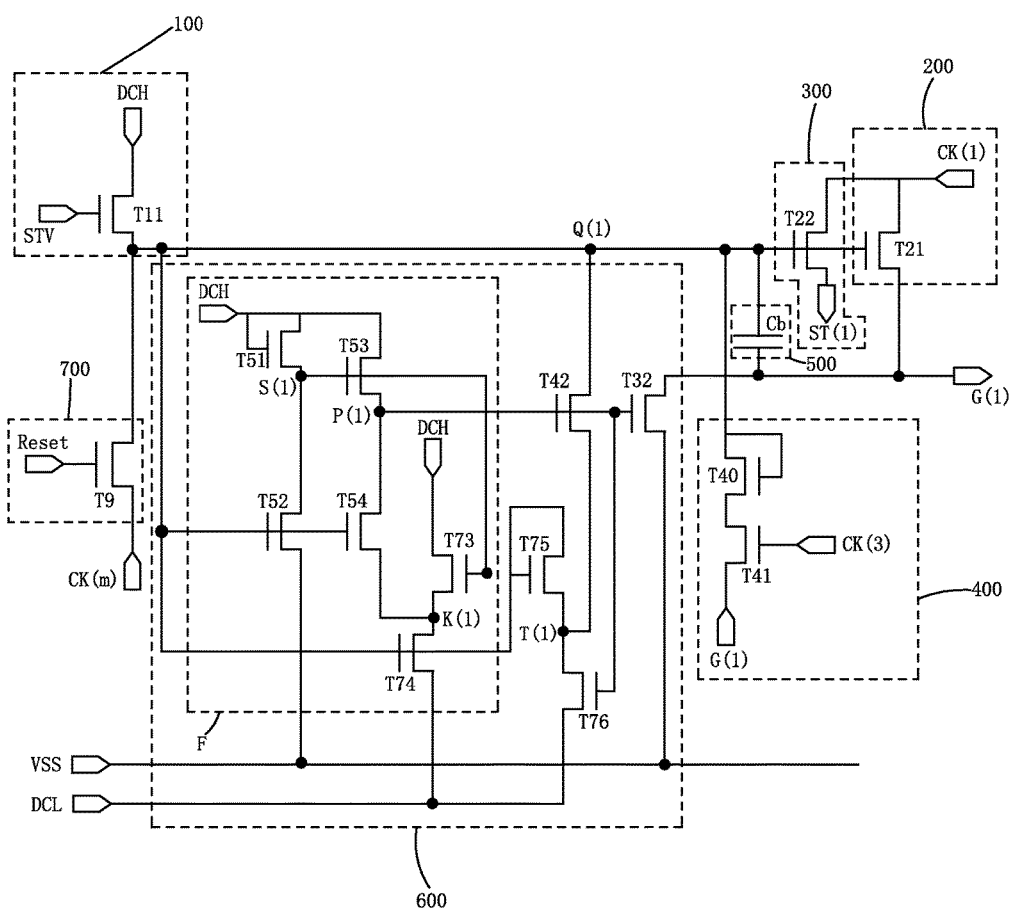
FIG. 9 is a connection relationship diagram of a GOA unit circuit of the first stage in the fourth embodiment according to the GOA circuit based on oxide semiconductor thin film transistor of the present invention.
Figure 10:
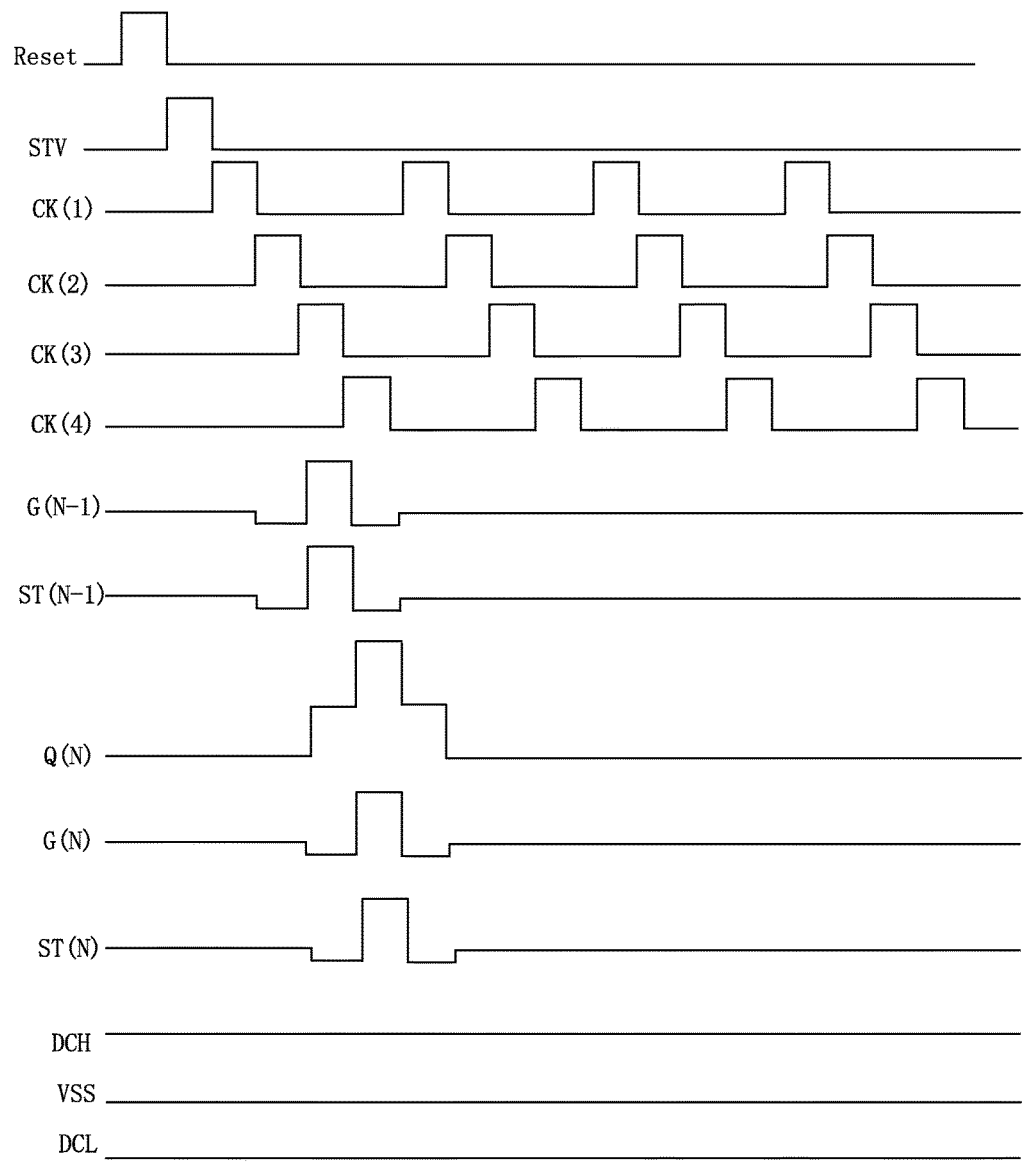
FIG. 10 is a waveform diagram of input signals and key nodes of the fourth embodiment according to the GOA circuit based on oxide semiconductor thin film transistor of the present invention.

Please refer to FIG. 8, FIG. 9, FIG. 10 and FIG. 11, which are the fourth embodiment according to a GOA circuit based on oxide semiconductor thin film transistor of the present invention. The reset module 700 is similarly provided in the fourth embodiment, and the difference from the third embodiment is that the source of the ninth thin film transistor T9 in the reset module 700 receives the reset signal Reset, i.e. the fourth embodiment requires a reset signal Reset which is different from the scan activation signal STV. As shown in FIG. 10, the reset signal Reset is generated before the scan activation signal STV. Under such circumstance, the reset module 700 can be provided in each of the GOA unit circuits from the first stage to the last stage.

Figure 11:
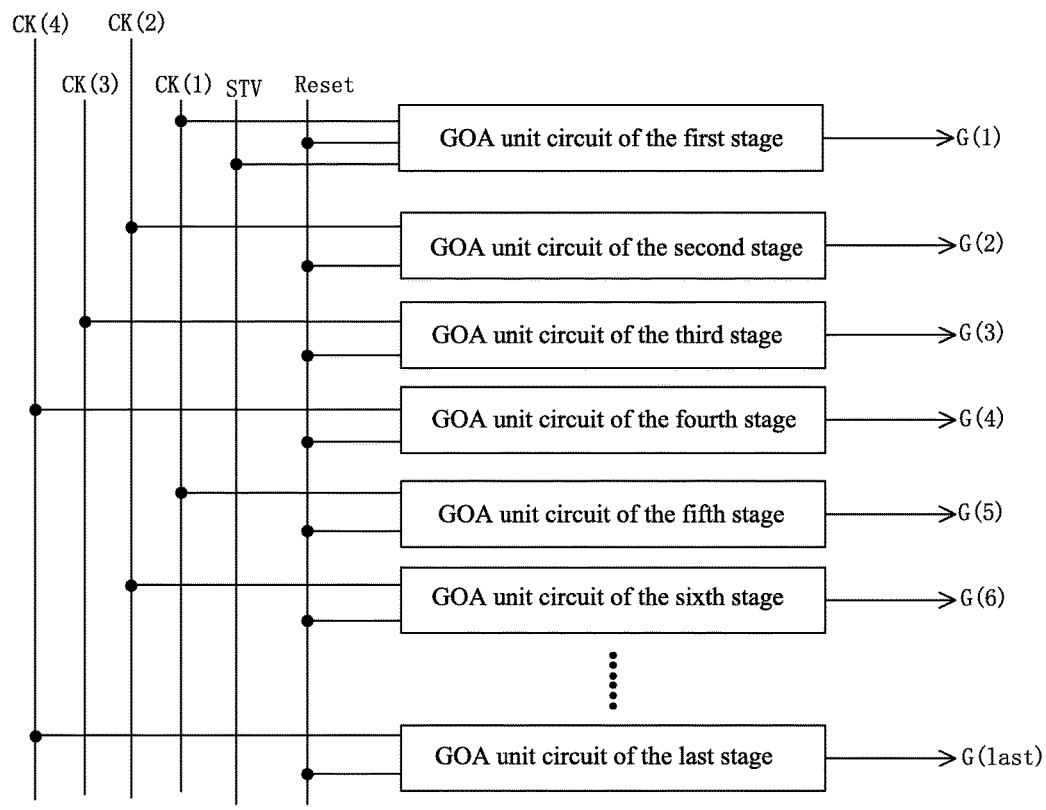
FIG. 11 is a connection structure diagram of the fourth embodiment according to the GOA circuit based on oxide semiconductor thin film transistor of the present invention.

The clock signal totally comprising four sets is illustrated. As shown in FIG. 9, FIG. 11, the GOA unit circuit of the first stage receives the reset signal Reset employed for controlling and resetting the reset module 700 and the scan activation signal STV employed for activating the scan driving; each of the GOA unit circuits from the second stage to the last stage receives the reset signal Reset employed for controlling and resetting the reset module 700, which similarly can reset the first node Q(N) with the reset signal Reset before generating the each frame to clear the interference of the residual charge to the GOA circuit, and similarly can reset the first node Q(N) before generating the first frame to prevent the influence of the first frame, which is blank, to the GOA circuit to guarantee the normal output of the GOA circuit and the normal display of the image.

In conclusion, the GOA circuit based on oxide semiconductor thin film transistor of the present invention cannot only prevent the electrical leakage to raise the reliability of the GOA circuit but also avoid the generation of the crossfire current in the non-function period by shorting the gate and the source of the fortieth thin film transistor in the first pull-down module for avoiding the influence of the constant high voltage level to the pull-down holding of the first node by electrically coupling both the gate and the drain of the seventy-fifth thin film transistor in the pull-down holding module to the first node, and clearing the interference of the residual charge to the GOA circuit by providing the reset module to reset the first node before generating the each frame to guarantee the normal output of the GOA circuit and the normal display of the image.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A gate-driver-on-array (GOA) circuit based on an oxide semiconductor thin film transistor, comprising a plurality of GOA unit circuits which are respectively arranged as a plurality of stages that are cascade connected, wherein the GOA unit circuit of each of the plurality of stages comprises a pull-up controlling module, a pull-up module, a transmission module, a first pull-down module, a bootstrap capacitor module and a pull-down holding module;

wherein for the GOA unit circuit of a predetermined one of the plurality of stages, which is connected, in a cascade form, between the GOA unit circuit of a previous one of plurality of stages and the GOA unit circuit of a next one of the plurality of stages:

the pull-up controlling module comprises a pull-up-controlling thin film transistor, which comprises a gate that receives a stage transfer signal of the GOA unit circuit of the previous stage, a source that is electrically coupled to a constant high voltage level, and a drain that is electrically coupled to a first node;

the pull-up module comprises: a pull-up thin film transistor, which comprises a gate that is electrically coupled to the first node, a source that is electrically coupled to a first set of clock signals corresponding to the GOA unit circuit of the predetermined stage, and a drain that outputs a scan driving signal;

the transmission module comprises: a transmission thin film transistor, which comprises a gate that is electrically coupled to the first node, a source that is electrically coupled to the first set of clock signals corresponding to the GOA unit circuit of the predetermined stage, and a drain that outputs a stage transfer signal;

the first pull-down module comprises a first first-pull-down thin film transistor and a second first-pull-down thin film transistor, wherein the first first-pull-down thin film transistor has a gate and a source that are both electrically coupled to the first node and a drain that is electrically coupled to a drain of the second first-pull-down thin film transistor; and the second first-pull-down thin film transistor comprises a gate that is inputted with a second set of clock signals corresponding to the GOA unit circuit of one of the plurality of stages that is next to the next stage, and a source that is inputted with the scan driving signal;

the bootstrap capacitor module comprises a capacitor, which has a first end that is electrically coupled to the first node and a second end that is electrically coupled to the scan drive signal;

the pull-down holding module comprises a dual inverter comprising a first pull-down-holding thin film transistor, a second pull-down-holding thin film transistor, a third pull-down-holding thin film transistor and a fourth pull-down-holding thin film transistor, wherein the dual inverter has an input end that is electrically coupled to the first node and an output end that is electrically coupled to a second node; the first pull-down-holding thin film transistor comprises a gate that is electrically coupled to the second node, a drain that is electrically coupled to the first node, and a source that is electrically coupled to a third node; the second pull-down-holding thin film transistor comprises a gate that is electrically coupled to the second node, a drain that is electrically coupled to the scan driving signal, and a source that is electrically coupled to a first constant negative voltage level; the third pull-down-holding thin film transistor comprises a gate and a drain that are both electrically coupled to the first node and a source that is electrically coupled to a third node; and the seventy-sixth thin film transistor comprises a gate that is electrically coupled to the second node, a drain that is electrically coupled to the third node, and a source that is electrically coupled to a second constant negative voltage level;

the second constant negative voltage level is lower than the first constant negative voltage level; and all the thin film transistors are oxide semiconductor thin film transistors; and wherein the gate and the source of the first first-pull-down thin film transistor that are both electrically coupled to the first node are shorted to each other and wherein the gate and the source of the third pull-down-holding thin film transistor that are both electrically coupled to the first node are shorted to each other.

2. The GOA circuit based on an oxide semiconductor thin film transistor according to claim 1, further comprising a reset module, which is employed to reset the first node before generating each frame.

3. The GOA circuit based on an oxide semiconductor thin film transistor according to claim 2, wherein the reset module comprises a reset thin film transistor, which comprises a gate that receives a scan activation signal, a drain that is electrically coupled to the first node, and a source that is electrically coupled to the first constant negative voltage level.

4. The GOA circuit based on an oxide semiconductor thin film transistor according to claim 3, wherein a clock signal group is provided and comprises a number of sets of clock signals, wherein the number is an integer multiple of 4, and wherein with the plurality of stages being sequentially numbered from one, the reset module is set in the GOA unit circuit of each of the plurality of stages of which the sequential number is greater than the number of the sets of clock signals.

5. The GOA circuit based on an oxide semiconductor thin film transistor according to claim 4, wherein the group of clock signals totally comprises four sets of clock signals, including: a primary set of clock signals, a secondary set of clock signals, a tertiary set of clock signals and a quaternary set of clock signals respectively corresponding to four successive ones of the plurality of stages, wherein for the first set of clock signals being the tertiary set of clock signals, the second set of clock signals is the primary set of clock signals, and for the first set of clock signals being the quaternary set of clock signals, the second set of clock signals is the secondary set of clock signals, wherein waveform duty ratio of the four sets of clock signals is 25/75; and wherein the reset module is provided in the GOA unit circuits from the fifth stage to the last stage.

6. The GOA circuit based on an oxide semiconductor thin film transistor according to claim 2, wherein the reset module comprises a reset thin film transistor, which comprises a gate that receives a scan activation signal, a drain that is electrically coupled to the first node, and a source that is electrically coupled to the first set of clock signals corresponding to the GOA unit circuit of the Nth stage.

7. The GOA circuit based on an oxide semiconductor thin film transistor according to claim 6, wherein a clock signal group is provided and comprises a number of sets of clock signals, wherein the number is an integer multiple of 4, and wherein with the plurality of stages being sequentially numbered from one, the reset module is set in the GOA unit circuit of each of the plurality of stages of which the sequential number is greater than the number of the sets of clock signals.

8. The GOA circuit based on an oxide semiconductor thin film transistor according to claim 7, wherein the group of clock signals totally comprises four sets of clock signals, including: a primary set of clock signals, a secondary set of clock signals, a tertiary set of clock signals and a quaternary set of clock signals respectively corresponding to four successive ones of the plurality of stages, wherein for the first set of clock signals being the tertiary set of clock signals, the second set of clock signals is the primary set of clock signals, and for the first set of clock signals being the quaternary set of clock signals, the second set of clock signals is the secondary set of clock signals, wherein waveform duty ratio of the four sets of clock signals is 25/75; and wherein the reset module is provided in the GOA unit circuits from the fifth stage to the last stage.

9. The GOA circuit based on an oxide semiconductor thin film transistor according to claim 2, wherein the reset module comprises a reset thin film transistor, which comprises a gate that receives a reset signal, a drain that is electrically coupled to the first node, and a source that is electrically coupled to the first set of clock signals corresponding to the GOA unit circuit of the predetermined stage; and the reset signal is generated before the scan activation signal.

10. The GOA circuit based on an oxide semiconductor thin film transistor according to claim 9, wherein the reset module is provided in the GOA unit circuit of each of the plurality of stages.

11. The GOA circuit based on an oxide semiconductor thin film transistor according to claim 1, wherein the dual inverter comprises a fifth pull-down-holding thin film transistor, which comprises a gate and a source that are both electrically coupled to the constant high voltage level and a drain that is electrically coupled to a fourth node; a sixth pull-down-holding thin film transistor, which comprises a gate that is electrically coupled to the first node, a drain that is electrically coupled to the fourth node, and a source that is electrically coupled to the first constant negative voltage level; a seventh pull-down-holding thin film transistor, which comprises a gate that is electrically coupled to the fourth node, a source that is electrically coupled to the constant high voltage level, and a drain that is electrically coupled to the second node; an eighth pull-down-holding thin film transistor, which comprises a gate that is electrically coupled to the first node, a drain that is electrically coupled to the second node, and a source that is electrically coupled to a fifth node; a ninth pull-down-holding thin film transistor, which comprises a gate that is electrically coupled to the fourth node, a source that is electrically coupled to the constant high voltage level, and a drain that is electrically coupled to the fifth node; and a tenth pull-down-holding thin film transistor, which comprises a gate that is electrically coupled to the first node, a source that is electrically coupled to the second constant negative voltage level, and a drain that is electrically coupled to the fifth node, wherein the fifth pull-down-holding thin film transistor, the sixth pull-down-holding thin film transistor, the seventh pull-down-holding thin film transistor and the eighth pull-down-holding thin film transistor collectively form a main inverter, and the ninth pull-down-holding thin film transistor and the tenth pull-down-holding thin film transistor collectively form an auxiliary inverter.

* * * * *